United States Patent [19]
Metz

[11] Patent Number: 4,748,420
[45] Date of Patent: May 31, 1988

[54] QUADCOMP AMPLIFIER

[75] Inventor: Arthur J. Metz, Gervais, Oreg.

[73] Assignee: Tektronix, Inc., Beaverton, Oreg.

[21] Appl. No.: 109,872

[22] Filed: Oct. 19, 1987

[51] Int. Cl.⁴ .......................... H03F 1/26; H03F 3/45
[52] U.S. Cl. ..................................... 330/149; 330/252; 330/151
[58] Field of Search ................ 330/69, 149, 151, 252, 330/261

[56] References Cited

U.S. PATENT DOCUMENTS 4,146,844  3/1979  Quinn .................................. 330/149
4,322,688  3/1982  Schlotzhauer et al. ........ 330/149 X
4,390,848  6/1983  Blauschild .......................... 330/151
4,491,803  1/1985  Metz et al. .......................... 330/261

Primary Examiner—Eugene R. LaRoche
Assistant Examiner—Steven J. Mottola
Attorney, Agent, or Firm—George T. Noe

[57] ABSTRACT

A differential transconductance amplifier includes two error amplifiers which provide an error correction current which linearizes a main differential amplifier. Two reference transistors coupled to the main differential amplifier provides two sets of input voltages to the two error correction amplifiers. The output currents of the main amplifier and the two error correction amplifiers are summed to produce a linearized output.

7 Claims, 1 Drawing Sheet

QUADCOMP AMPLIFIER

BACKGROUND OF THE INVENTION

The present invention relates generally to differential amplifier circuits, and in particular to linear differential transconductance amplifier circuits which are compensated in some manner to reduce error.

Simple differential transconductance amplifiers produce an undesirable error output current if a large differential voltage input is present or if thermal distortion is present due to transistor self heating. Several transconductance amplifier circuits have been disclosed which use a correction signal to reduce this error current by using a separate error amplifier to linearize the output of a main signal amplifier. In U.S. Pat. Nos. 4,146,844, 4,322,688, amplifier circuits include a main differential amplifier, a common base stage, and an error amplifier whose inputs are connected to the emitters of the common base stage and whose outputs are connected to the collectors of the common base stage. In U.S. Pat. No. 4,390,848 an amplifier circuit includes a main differential amplifier having an emitter resistor, and an error amplifier whose inputs are connected across the emitter resistor and whose outputs are connected to the outputs of the main differential amplifier.

These prior art circuits, while capable of reducing unwanted error current, do so at the expense of additional power consumption. For the above configurations to work, the error amplifier itself must be perfectly linear. That is, additional errors may not be introduced by the error amplifier itself. The most common technique for ensuring the linearity of the error amplifier is by maintaining sufficient emitter bias current. This bias current, however, is not put to any other useful purpose in the circuit.

What is desired is a linearized differential amplifier in which the error amplifier bias current may be reused by the main differential amplifier to produce greater linearity with less power consumption.

SUMMARY OF THE INVENTION

In accordance with the present invention a differential transconductance amplifier includes two error amplifiers which provide an error correction current which linearizes a main differential amplifier. A part of the error amplifier bias current is reused by the main differential amplifier, resulting in linear performance without additional power consumption.

In a preferred embodiment of the invention, a main differential amplifier stage is formed by two bipolar transistors whose emitters are coupled through a single emitter resistor. The main differential amplifier stage provides the majority of the signal gain, which includes an error term for large input voltages. A pair of reference transistors is in common base connection with each of the main differential amplifier transistors. These reference transistors, in conjunction with each of the main differential amplifier transistors form a pair of input voltages for the two error correction amplifiers. Each error amplifier includes two bipolar transistors, a single emitter resistor having the same value as the main differential amplifier emitter resistor, and two emitter current sources. The output current of the two error correction amplifiers are returned to the reference transistors and the main differential amplifier in a manner which cancels the error current produced by the main differential amplifier.

DESCRIPTION OF THE PREFERRED EMBODIMENT

Figure 1:
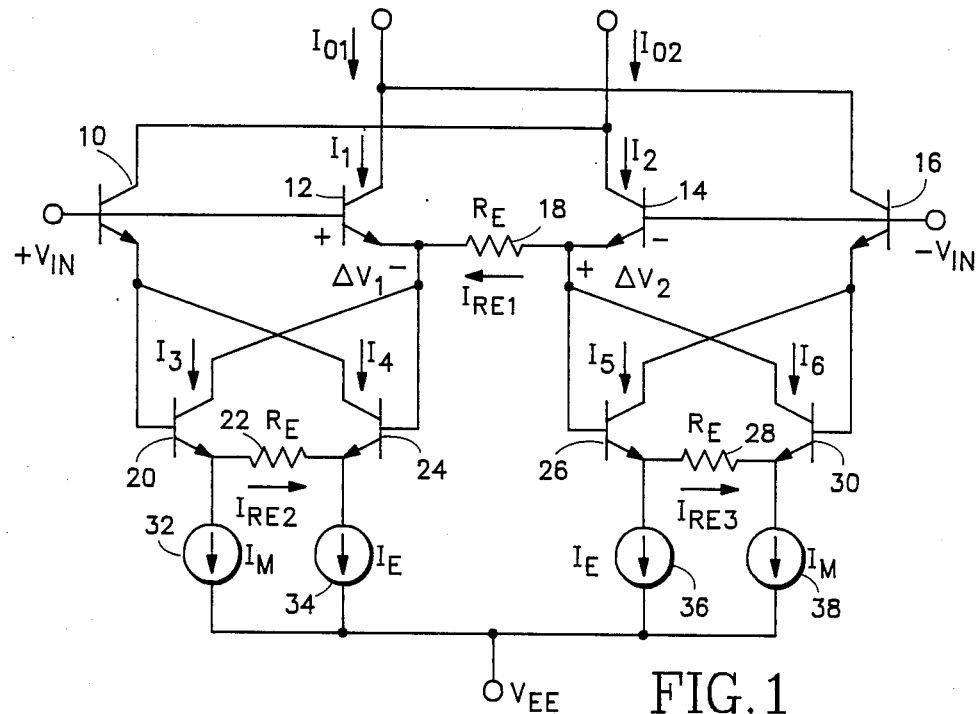
FIG. 1 is a schematic diagram of the preferred embodiment in accordance with the present invention.

In FIG. 1, a differential transconductance amplifier is shown in which a main differential amplifier comprises transistors 12 and 14, and emitter resistor 18. The main differential amplifier receives the input voltage at the bases of transistors 12 and 14, and, at the collectors of transistors 12 and 14, provides the majority of the signal current output, as well as an error current output. A pair of reference devices comprising transistors 10 and 16 have their bases connected to the bases of transistors 12 and 14, respectively. The reference devices may be bipolar transistors, MOS transistors, or any three terminal circuit having a high impedance input, a positive output for sinking current, and a negative output for establishing a voltage and sourcing current. The voltage between the emitter of transistor 10 and the emitter of transistor 12 is an input voltage for a error amplifier comprising of transistors 20 and 24, emitter resistor 22, and current sources 32 and 34. The voltage between the emitter of transistor 14 and the emitter of transistor 16 is an input voltage for a second error amplifier comprising transistors 26 and 30, emitter resistor 28, and current sources 36 and 38. The differential currents generated by the two error correction amplifiers are summed with the main differential amplifier current to form a linearized output current. The similarity of the error amplifiers to a cross quad circuit (QUAD) and their ability to generate an error compensation current (COMP) provide the basis for the coined term QUADCOMP amplifier.

In the quiescent condition, where no differential voltage is applied to the amplifier, and neglecting the effects of transistor beta and error voltage, the biasing and operation of the amplifier becomes readily apparent. The current generated by current sources 32 and 38 flow through transistors 20 and 30, respectively, to provide current biasing as in a simple differential pair of transistors having an emitter resistor. The current generated by current sources 34 and 36 flow through transistors 24 and 26, respectively, and into reference transistors 10 and 16, respectively.

Assuming now that a differential signal voltage is present which appears across emitter resistor 18 and produces a differential signal current, and that bias current sources 32 and 38 have a value of $I_M$ and that bias current sources 34 and 36 have a value of $I_E$, an expression may be written for the differential output current. No differential current is produced by the error amplifiers since $dV_1$ and $dV_2$ are assumed to be zero. Thus, the total differential output current of the amplifier is given by the expression:

$$I_O = I_{O1} - I_{O2}$$
$$= I_M + I_E + (+V_{IN}, -V_{IN})/R_E -$$
$$(I_M + I_E - (+V_{IN}, -V_{IN})/R_E)$$
$$= 2*(+V_{IN}, -V_{IN})/R_E$$

Assuming now that because of an applied input differential voltage, an error voltage is present in the main differential amplifier. Referring to FIG. 1, an error voltage is shown by the voltages $dV_1$ and $dV_2$. Note that the error voltage $dV_1$ is shown to add to the emitter base junction voltage of transistor 12, whereas error voltage $dV_2$ is shown to subtract from the emitter base voltage of transistor 14. The amplifier is designed to cancel out the currents produced by these error voltages. Put another way, the output current of the amplifier, $I_{O1} - I_{O2}$, should not contain any error current.

For convenience of analysis, the differential current flowing due to the input voltage is ignored. The following analysis shows where the error currents appear in the amplifier and the method by which they are cancelled.

The currents labeled in FIG. 1 may be defined in terms of the error voltages and emitter resistors. The three currents flowing through the emitter resistors are given by the expressions:

$$I_{RE1} = (dV_1 + dV_2)/R_E \quad (1)$$

$$I_{RE2} = dV_1/R_E \quad (2)$$

$$I_{RE3} = dV_2/R_E \quad (3)$$

Neglecting the effects of transistor beta, the error correction amplifier output currents are given by the expressions:

$$I_3 = I_{RE2} \quad (4)$$

$$I_4 = -I_{RE2} \quad (5)$$

$$I_5 = I_{RE3} \quad (6)$$

$$I_6 = -I_{RE3} \quad (7)$$

The current in the collectors of the main differential amplifier is given by the expressions:

$$I_1 = I_3 - I_{RE1} \quad (8)$$

$$I_2 = I_6 + I_{RE1} \quad (9)$$

The total output differential current is given by:

$$I_O = I_{O1} - I_{O2} = I_1 + I_5 - (I_2 + I_4)$$

Substituting from equations (8), (9), (5) and (6) the output differential current is given by:

$$I_O = I_3 - I_{RE1} + I_{RE3} - (I_6 + I_{RE1} - I_{RE2})$$

Further substituting from equations (4) and (7), and equations (1), (2) and (3) the output current is given by:

$$I_O = dV_1/R_E - (dV_1 + dV_2)/R_E + dV_2/R_E -$$
$$(-dV_2/R_E + (dV_1 + dV_2)/R_E - dV_1/R_E)$$
$$= 0$$

Thus it has been shown that the amplifier provides a measure of linearization of error currents produced by error voltages in the main differential amplifier.

It should be noted that the error amplifiers, which provide the error correction also provide the bias current for the main differential amplifier. Current sources 32 and 38 provide the bias for transistors 20 and 30, and also provide the bias for transistors 12 and 14. Only the current from current sources 34 and 36 is not reused. This configuration permits a power saving, since separate current sources for the main differential amplifier are not needed.

A further advantage of the present invention is that the error amplifiers are self linearizing. This is important in minimizing second order error effects of the error amplifiers. Assuming that transistor 24 has a small error term which subtracts from its emitter base voltage, and that transistor 20 has a small error term which adds to its emitter base voltage, these expressions may be written as:

$$V_{BE}(24) = V - dV_A$$

$$V_{BE}(20) = V + dV_B$$

However, since the resultant current of transistors 20 and 24 flow into transistors 10 and 12, respectively, the resultant emitter base junction voltage expressions are given by:

$$V_{BE}(10) = V - dV_A$$

$$V_{BE}(12) \approx V + dV_B$$

The total voltage across the emitter resistor 22 is given by:

$$V(22) \approx V_{BE}(10) + V_{BE}(20) - (V_{BE}(12) + V_{BE}(24))$$
$$\approx 2*V - dV_A + dV_B - (2*V - dV_A + dV_B)$$
$$\approx 0$$

Thus, almost no voltage appears across emitter resistor 22 due to error voltages within the error amplifier. Therefore the error amplifiers do not add significant second order error current to the main differential amplifier and are self linearizing.

Due to the error correction of the main amplifier and the self linearizing property of the error amplifiers, an additional advantage is realized. That is, the amplifier exhibits sharp limiting. As one of the input devices approaches cutoff, conventional uncorrected amplifiers exhibit large gain changes; the present invention maintains substantially constant gain.

Figure 2:
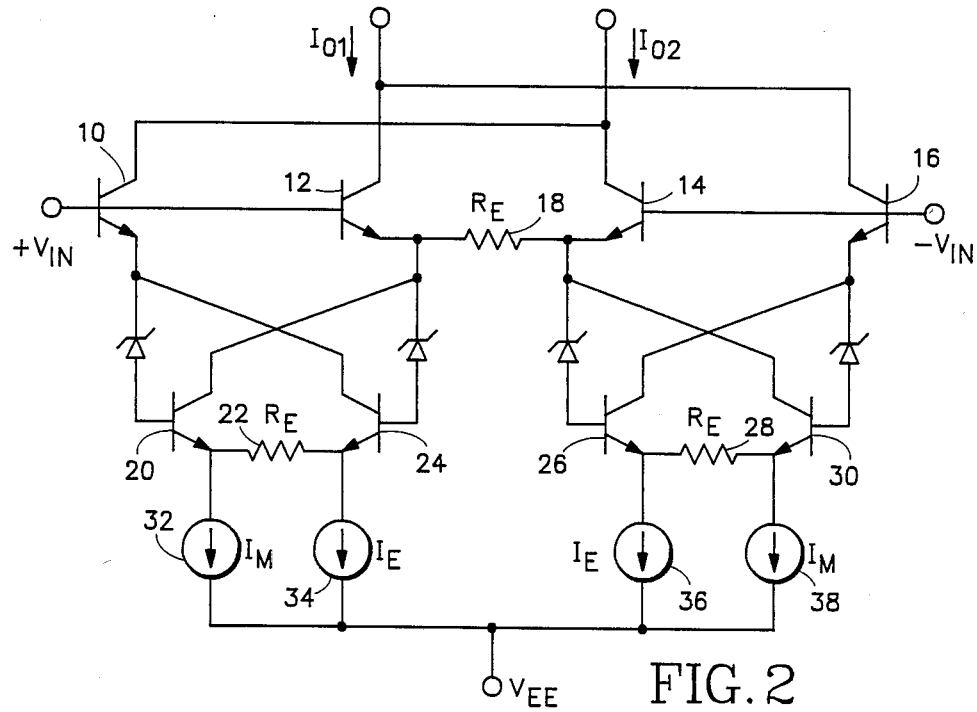
FIG. 2 is a schematic diagram of an alternative embodiment in accordance with the present invention.

To prevent saturation of the error correction amplifiers for excessive differential voltage input a modification of the error correction amplifiers may be made. As shown in FIG. 2, voltage shifting circuits such as zener diodes or the like may be inserted in series with the bases of transistors 20, 24, 26 and 30.

As in any integrated circuit, it is desirable to match the devices. For optimum performance, it is desirable to match transistors 10 and 16; transistors 12 and 14; resistors 18, 22, and 28, transistors 20 and 24; and transistors 26 and 30. Current sources 32, 34, 36 and 38 may be matched. Matched current sources 32 and 38 may be ratioed to matched current sources 34 and 36; in a ratioed configuration, it is also desirable to maintain the same ratio between the emitter areas of matched transistors 20 and 30 to the emitter areas of matched transistors 24 and 26. In addition, it is desirable to maintain proper thermal matching of transistors 10 and 16, in order that the proper input voltage may be presented to the error correction amplifiers.

It can be discerned from the foregoing description that an advantage of the present invention is the reuse of the error amplifier bias currents in a manner which provides linear performance while minimizing power consumption. Another advantage of the present invention is that the error amplifiers, due to the configuration of the reference transistors and the main differential amplifier, are self linearizing. That is, in a first order analysis, no error voltage is present across the error amplifier emitter resistor. A further advantage of the present invention is that of high gain. The error amplifiers introduce a measure of positive feedback into the main differential amplifier resulting in a higher gain.

I claim:

1. A differential transconductance amplifier for converting an input differential voltage into an output differential current comprising:
    a. a main differential amplifier having first and second inputs for receiving the input differential voltage, first and second outputs, and first and second emitter terminals;
    b. first and second reference devices each having an input, a positive output and a negative output, each input being respectively coupled to said first and second main differential amplifier inputs, and the positive outputs of said first and second reference devices being respectively cross coupled to said first and second main differential amplifier outputs for providing said output differential current; and
    c. first and second error correction amplifiers each having a pair of inputs and a pair of outputs, the inputs of said first error correction amplifier being coupled between the negative output of said first reference device and said first emitter terminal, the outputs of said first error correction amplifier being crosscoupled thereto, the inputs of said second error correction amplifier being coupled between said second emitter terminal and the negative output of said second reference device, the outputs of said second error correction amplifier being crosscoupled thereto.

2. A differential transconductance amplifier as in claim 1, wherein said main differential amplifier comprises a pair of transistors, each having a base, a collector and an emitter, said emitters being coupled through an emitter resistor, said emitters forming said first and second emitter terminals, said collectors forming said first and second outputs, and said bases forming said first and second inputs.

3. A differential transconductance amplifier as in claim 2, wherein said error correction amplifiers each comprise a pair of transistors, each having a base, a collector and an emitter, said emitters being coupled through an emitter resistor having substantially the same value as said main differential amplifier emitter resistor and each of said emitters being coupled to a current source, said bases forming said inputs, and said collectors forming said outputs.

4. A differential transconductance amplifier as in claim 1, wherein said reference devices each comprise a transistor having an emitter, base and collector, the emitter forming the negative output, the base forming the input, and the collector forming the positive output.

5. A differential transconductance amplifier as in claim 1, wherein said error correction amplifiers each comprise a pair of transistors, each having a base, a collector and an emitter, said emitters being coupled through an emitter resistor and each of said emitters being coupled to a current source, said bases forming said inputs, and said collectors forming said outputs.

6. A differential transconductance amplifier as in claim 5, wherein each of said error correction amplifiers further comprise a pair of voltage shifting circuits, each interposed respectively between said inputs and said bases.

7. A differential transconductance amplifier as in claim 5, wherein the ratio of the emitter sizes of said transistors and the ratio of the value of said current sources is substantially the same.

* * * * *